(12) United States Patent
Wang et al.

(10) Patent No.: US 7,868,303 B2
(45) Date of Patent: Jan. 11, 2011

(54) METHOD AND HANDLING APPARATUS FOR PLACING PATTERNING DEVICE ON SUPPORT MEMBER FOR CHARGED PARTICLE BEAM IMAGING

(75) Inventors: You-Jin Wang, Milpitas, CA (US); Hsuan-Bin Huang, Kaohsiung (TW); Chung-Shih Pan, Palo Alto, CA (US)

(73) Assignee: Hermes Microvision, Inc., Hsinchu (TW)

( * ) Notice: Subject to any disclaimer, the term of this patent is extended or adjusted under 35 U.S.C. 154(b) by 277 days.

(21) Appl. No.: 12/249,640

(22) Filed: Oct. 10, 2008

(65) Prior Publication Data

US 2010/0090107 A1    Apr. 15, 2010

(51) Int. Cl.
  *G01J 1/00*    (2006.01)
  *G01N 21/00*   (2006.01)
  *G01N 23/00*   (2006.01)
(52) U.S. Cl. .................... 250/491.1; 250/306; 250/307; 250/310; 250/311; 250/442.11
(58) Field of Classification Search ................ 250/306, 250/307, 310, 311, 442.11, 491.1
See application file for complete search history.

(56) References Cited

U.S. PATENT DOCUMENTS

2010/0102226 A1*  4/2010  Huang et al. ............... 250/310
2010/0165346 A1*  7/2010  Wang et al. ................ 356/445

\* cited by examiner

*Primary Examiner*—Jack I Berman
*Assistant Examiner*—Meenakshi S Sahu
(74) *Attorney, Agent, or Firm*—Muncy, Geissler, Olds & Lowe, PLLC (57) ABSTRACT

A patterning device handling apparatus for use in charged particle beam imaging is disclosed. The disclosed patterning device handling apparatus comprises a first gripping member and a second gripping member. The first gripping member is equipped with a plurality of first positioning projections, and the second gripping member is equipped with a plurality of second positioning projections. When the patterning device is held at one angle, the first positioning projections abut against one edge of the patterning device and the second positioning projections abut against the opposite edge of the patterning device. When the patterning device is held at another angle, the first positioning projections abut against two neighboring edges of the patterning device, and the second positioning projections abut against the other two neighboring edges of the patterning device. Therefore, the disclosed patterning device handling apparatus can hold the pattering device at different angles.

24 Claims, 7 Drawing Sheets

METHOD AND HANDLING APPARATUS FOR PLACING PATTERNING DEVICE ON SUPPORT MEMBER FOR CHARGED PARTICLE BEAM IMAGING

BACKGROUND OF THE INVENTION

1. Field of the Invention

The present invention relates to a patterning device handling apparatus and, more especially, to a patterning device handling apparatus used in charged particle beam imaging.

2. Background of the Related Art

A patterning device, such as a mask must be moved from a storage chamber to an imaging chamber when a scanning electron microscopes (SEM) is applied to inspect the mask. Patterning device handling apparatus is used to move the mask. A flexible method of moving mask and a deft patterning device handling apparatus will enhance the efficiency of SEM.

SUMMARY OF THE INVENTION

One object of this invention is to provide a patterning device handling apparatus for use in charged particle beam imaging.

An exemplary patterning device handling apparatus of the present invention is provided. The patterning device handling apparatus comprises a gripper for holding a patterning device at different angles. The gripper comprises a first gripping member and a second gripping member. The first gripping member is equipped with a first plurality of positioning projections and the second gripping member equipped with a second plurality of positioning projections. A gripping force provider connects to the second gripping member to move the second gripping member along a straight track relative to the first gripping member. The second gripping member moves toward the first gripping member to fix a patterning device between the first plurality of positioning projections and the second plurality of positioning projections.

The first positioning projections and the second positioning projections can abut the opposite or neighboring edges of the patterning device to hold tight the patterning device at different angles.

DETAILED DESCRIPTION OF THE INVENTION

Figure 1:
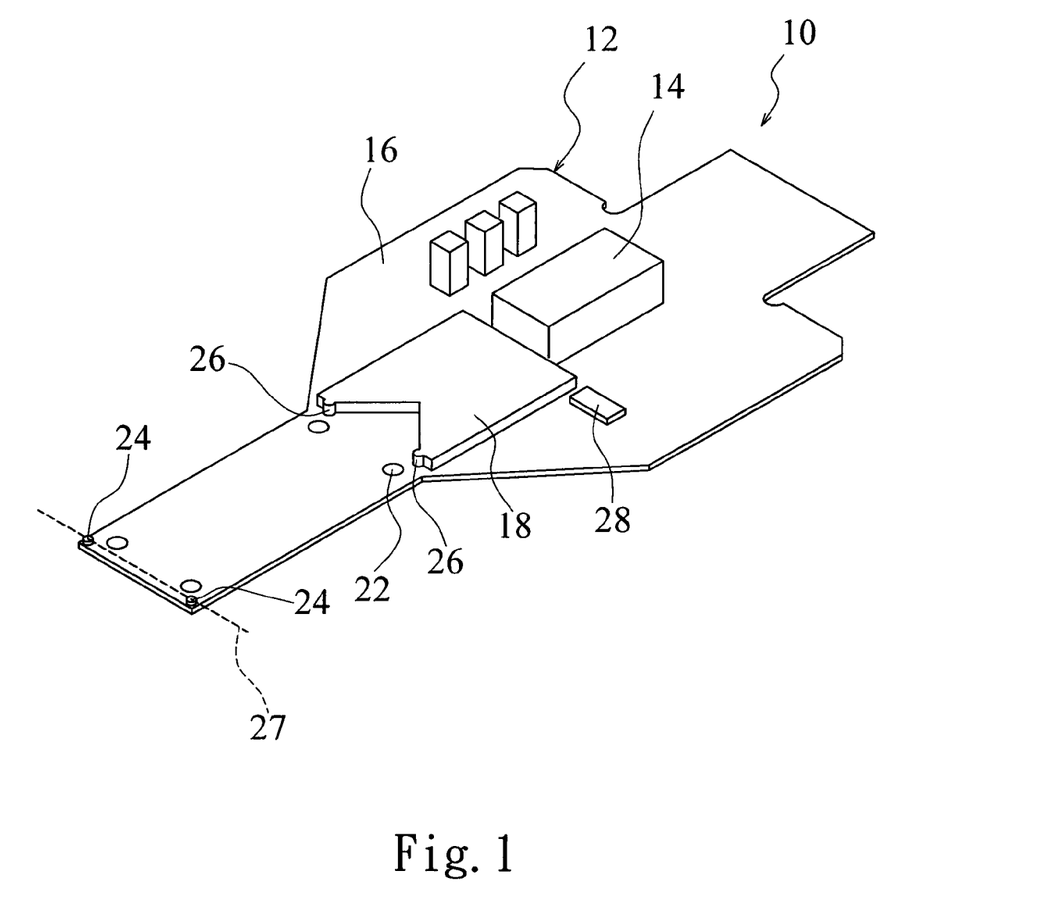
FIG. 1 is a schematic diagram illustrating the structure of a patterning device handling apparatus for a charged particle beam imaging system in accordance with an example of the present invention.

FIG. 1 is a schematic diagram illustrating the structure of a patterning device handling apparatus for charged particle beam imaging in accordance with an example of the present invention. The disclosed patterning device handling apparatus 10 comprises a gripper 12 for holding the patterning device and a gripping force provider 14. The gripper 12 comprises a first gripping member 16 and a second gripping member 18, which are equipped with first positioning projections 24 and second positioning projections 26 respectively. The gripping force provider 14 connects and moves the second gripping member 18 along a straight track relative to the first gripping member 16. The gripping force provider 14 may be an air cylinder, a liquid cylinder, a vacuum producer, a motor, or a spring. In addition, hard pads 22 disposed on the first gripping member 16 are used to prevent the patterning device being handled from directly contacting the first gripping member 16.

Figure 2:
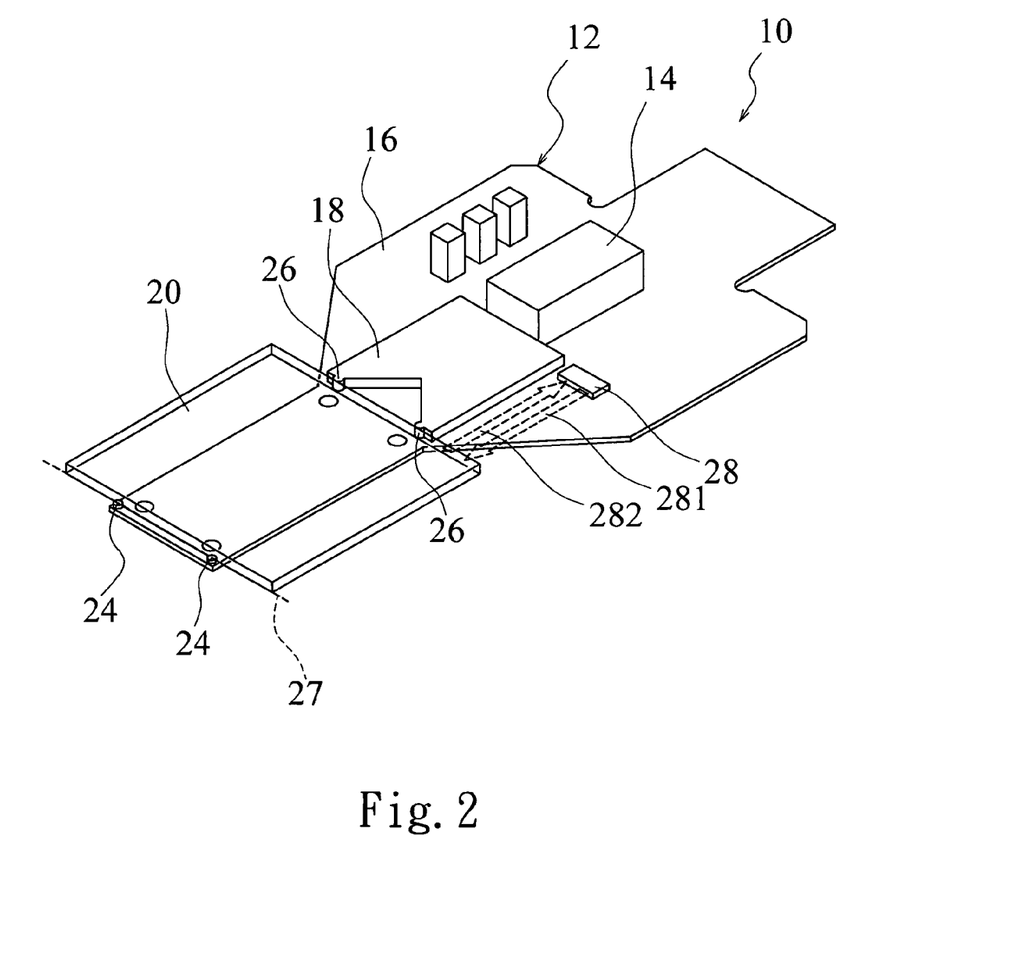
FIG. 2 is a schematic diagram illustrating a patterning device handling apparatus for a charged particle beam imaging system in application in accordance with an example of the present invention.

As shown in FIG. 2, the gripping force provider 14 moves the second gripping member 18 forward to fix a patterning device 20 between the first positioning projections 24 and the second positioning projections 26.

Figure 3:
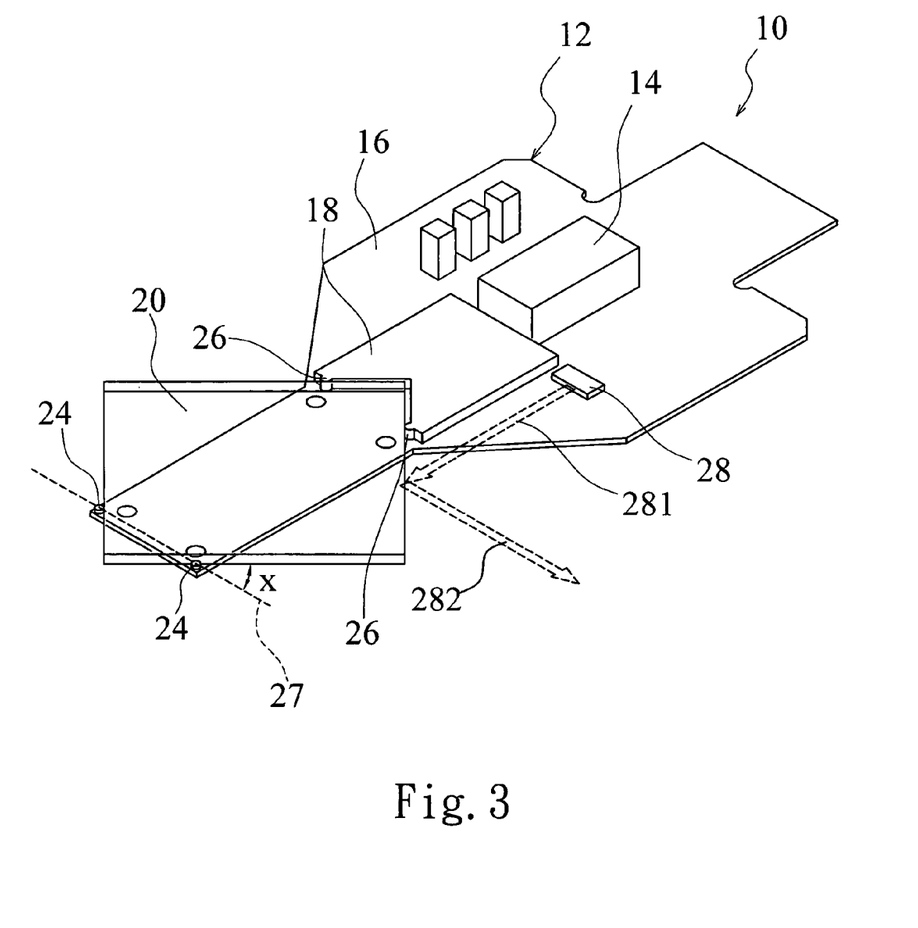
FIG. 3 is a schematic diagram illustrating a patterning device handling apparatus for a charged particle beam imaging system in another application in accordance with an example of the present invention.

In the example shown in FIG. 2 and FIG. 3, the first positioning projections 24 and the second positioning projections 26 respectively abut the two opposite edges or the two neighboring edges of opposite corners of the patterning device 20 to clip or hold the patterning device 20. The angle of the patterning device 20 is defined by an imaginary line 27, shown in FIG. 1, passing through the two first positioning projections 24. For example, please refer to FIG. 2, one of the edges of the patterning device 20 may be aligned with the imaginary line 27 thereby defining the patterning device 20 at an angle of 0 degree. Or, referring to FIG. 3, the patterning device 20 may be placed such that none of its edges is aligned with the imaginary line 27 but at an angle of x degree with it, thereby defining the patterning device 20 at an angle of x or (90-x) degree.

Further, as shown in FIG. 1, 2 and 3, an angle sensor 28 is configured on the first gripping member 16. The angle sensor 28 emits a detection signal 281 toward the patterning device 20 and detects the reflective signal 282 from the patterning device 20. A control unit (not shown) connects the angle sensor 28 to determine the angle of the patterning device 20 according to the detection result of the angle sensor 28. The angle detection signals (281, 282) maybe the visible light, UV, IR, laser, or supersonic wave. The angle sensor 28 detects a strong reflection signal 282 in the example shown in FIG. 2, but a weak or no reflection signal 282 in the example shown in FIG. 3.

Figure 4:
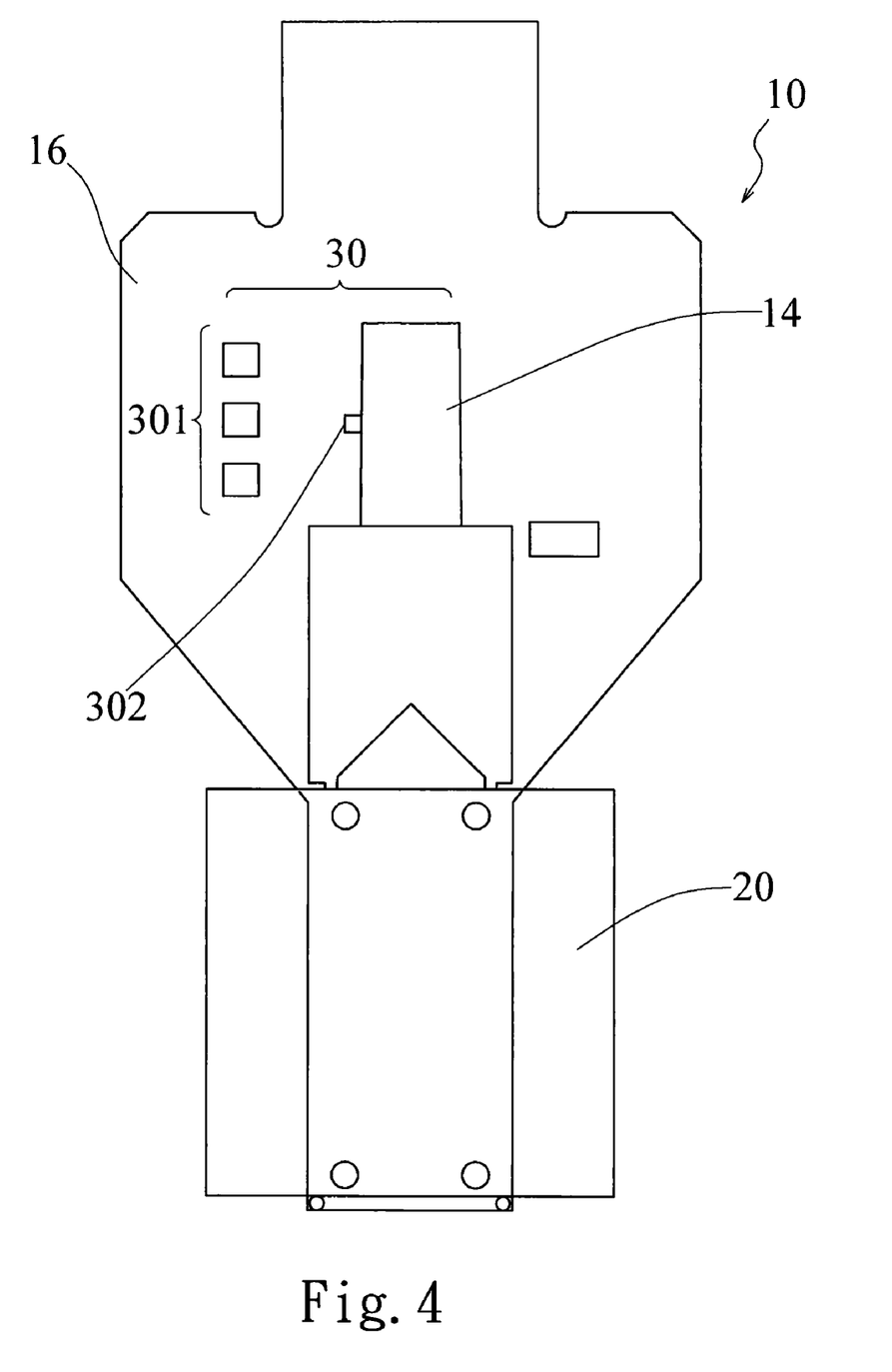
FIG. 4 is a top view schematic illustrating a patterning device handling apparatus of a charged particle beam imaging system in application in accordance with an example of the present invention.

Moreover, in one example embodiment, a gripping status sensor 30 is configured on the patterning device handling apparatus 10 as shown in FIG. 4. The gripping status sensor 30 comprises a set of gripper detection signal transmitters 301 arranged on the first gripping member 16, and a receiver 302 arranged on the gripping force provider 14 corresponding to the transmitters 301. The receiver 302 receives a gripper detection signal from the gripper detection signal transmitters 301 to determine the gripping status of the patterning device 20.

It is noted that as will be understood by those skilled in the art, to carry out the mission of gripping status detection, the transmitting and receiving functions are exchangeable between the pairing devices 301 and 302, that is, 302 may be a transmitter and 301 may be a receiver. For example, (1) there are three transmitters arranged on the first gripping member, and one receiver arranged on the gripping force provider; (2) there are one transmitter arranged on the first gripping member, and three receivers arranged on the gripping force provider; (3) there are three receivers arranged on the first gripping member, and one transmitter arranged on the gripping force provider; or (4) there are one receiver arranged on the first gripping member, and three transmitters arranged on the gripping force provider.

The second gripping member 18 and the first gripping member 16 have varying relative positions when the second gripping member 18 moves. In this example, as the second gripping member 18 moves along, the receiver 302 receives a gripper detection signal the transmitters 301 with a changing location indicating a different location of the second gripping member 18 thus different gripping status of the patterning device 20. Finally, the detected gripper detection signal is sent to a control unit (not shown) for determining the gripping status of the patterning device 20.

For example, in the configuration in FIG. 4, the gripping status may be a "home" status i.e. a normal stand-by status for the patterning device handling apparatus 10 when the receiver 302 is aligned with the top transmitter 301 and a "no sample" status when the receiver 302 is aligned with the bottom transmitter 302. The receiver 302 being aligned with the middle transmitter 301 may indicate a "held-tight" status for the patterning device handling apparatus 10. The gripping status and angle position of the patterning device 20 must match for the patterning device handling process to proceed. For example, if the gripping status is indicated to be "held-tight" and the patterning device 20 is supposed to be at an angle of 0 degree at such status, the angle sensor 28 must report so for the process to advance. The gripper detection signals maybe the visible light, UV, IR, laser, magnet, or supersonic wave.

Figure 5:
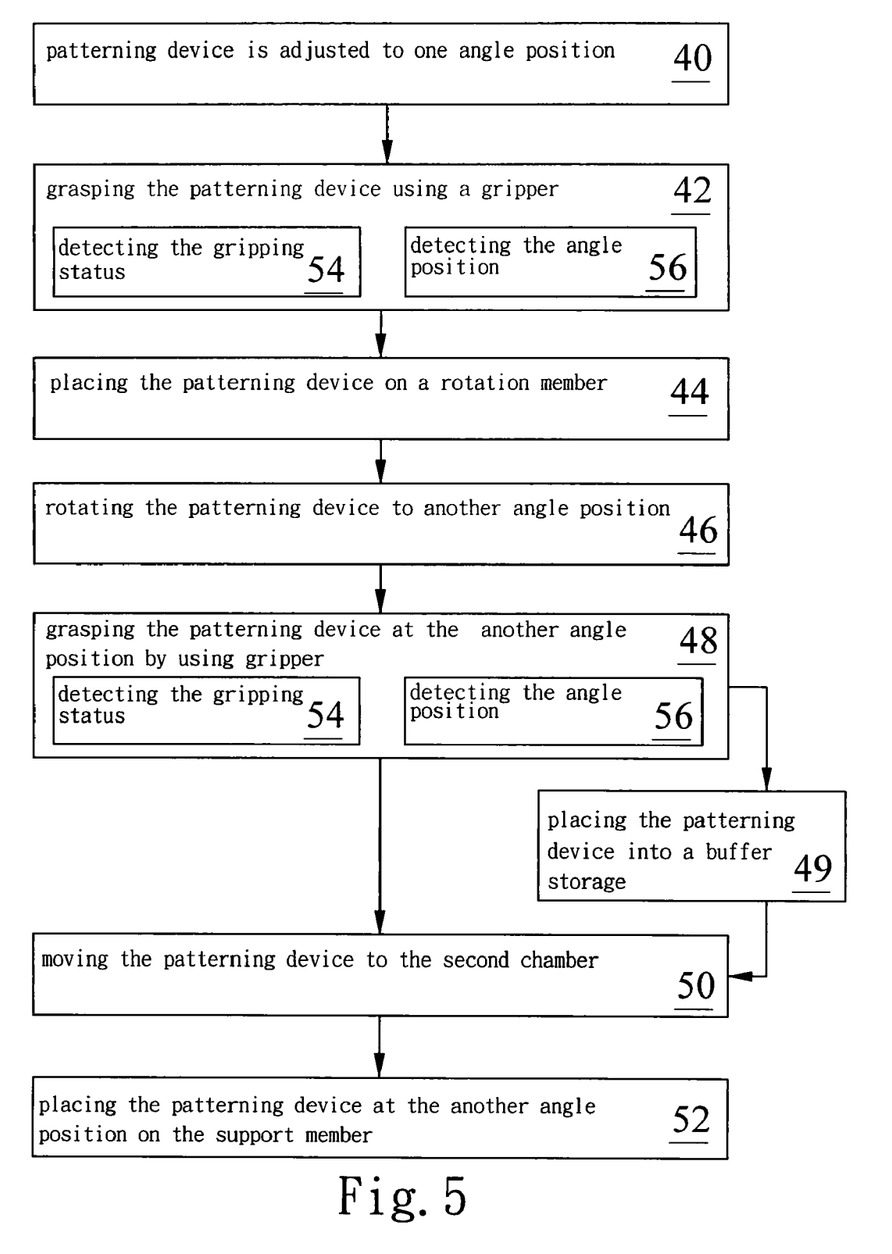
FIG. 5 is a flow chart illustrating a method of placing a patterning device on a support member within a second chamber from a first chamber for charged particle beam imaging in accordance with an example of the present invention.
Figure 6:
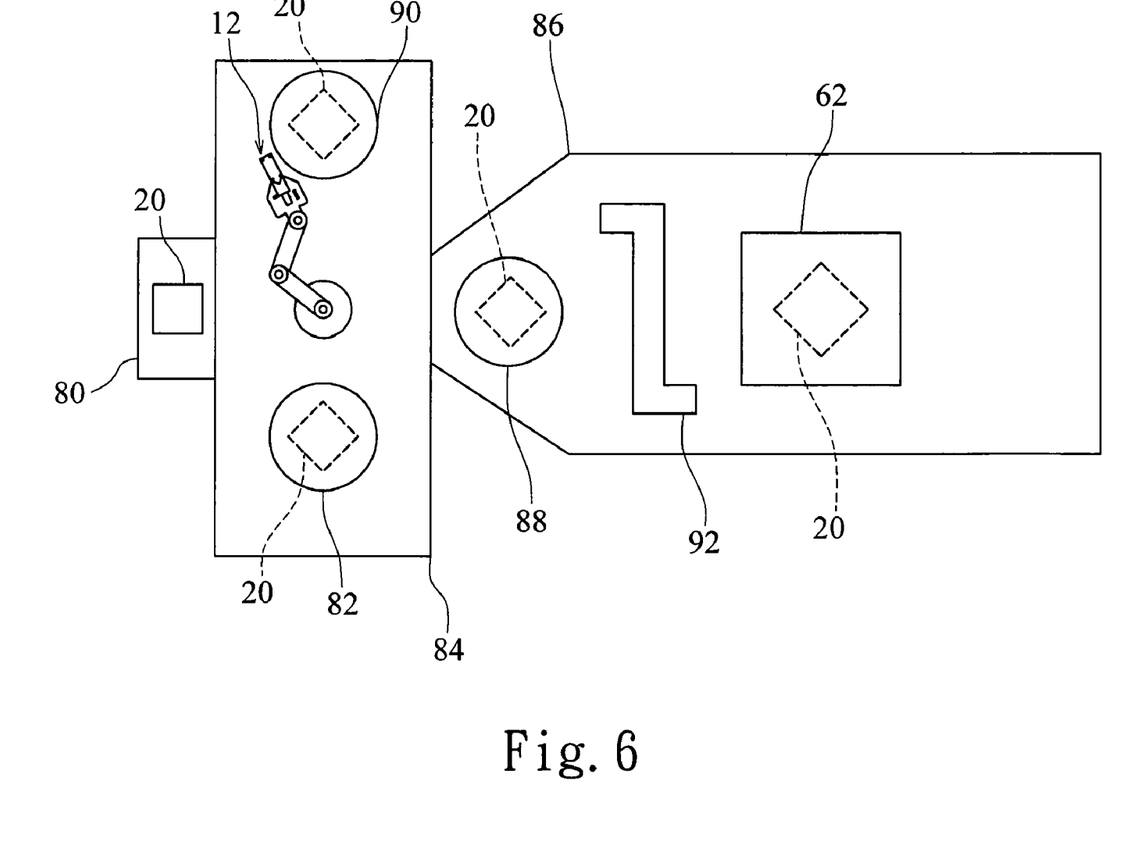
FIG. 6 is a schematic diagram illustrating a mask being transferred from a first chamber to a second chamber.

FIG. 5 is a flow chart illustrating a method of placing a patterning device on a support member within a second chamber from a first chamber for charged particle beam imaging in accordance with an example of the present invention. FIG. 6 is a schematic diagram illustrating a patterning device being transferred from a first chamber to a second chamber. Please refer to FIG. 5 and FIG. 6 simultaneously. The method of placing a patterning device on a support member comprises the following steps. In step 40, the patterning device 20 is adjusted to one angle position inside a carrier box 80 which is used for pre-imaging and post-imaging storage of the patterning device 20, and in step 42, the patterning device 20 is grasped using a gripper 12. Next, in step 44, the gripper 12 is used to place the patterning device 20 on a rotation member 82 set within a first chamber 84, and then in step 46, the rotation member 82 is rotated to cause the patterning device 20 to be rotated to another angle position. It is noted that the patterning device 20 at another angle position is illustrated by dotted line in FIG. 6. Next, in step 48 and step 50, the patterning device 20 at another angle position is grasped again and moved to the second chamber 86 using the gripper 12. Finally, in step 52, the patterning device 20 at another angle position is placed on the support member 88 within the second chamber 86 using the gripper 12. Furthermore, the patterning device 20 on support member 88 is then moved to another support member 62 for charged particle beam imaging by a working arm 92.

As shown in FIG. 5, after step 48 of grasping the patterning device at another angle position, a step 49 is optionally performed. In step 49, the patterning device 20 at another angle position can be placed into a buffer storage 90, shown in FIG. 6, first using the gripper 12 for waiting to be moved to the second chamber 86 at a later time.

Continuously, as shown in FIG. 5, after step 42 of grasping the patterning device at the one angle position, or after step 48 of grasping the patterning device at the another angle position, a step 54 of detecting a gripping status of the patterning device and a step 56 of detecting the angle position of the patterning device are proceeded. Step 54 and 56 will be further described with reference to the earlier descriptions of relevant components in conjunction with FIG. 1~4.

In step 54, the alignment of the gripper detection signal transmitters and corresponding receivers is detected by a gripping status sensor, and then a gripping status sensor signal is outputted to a control unit (not shown). When one of the gripper detection signal transmitters is in alignment with its corresponding receiver, the aligned transmitter and receiver are in communication by a gripper detection signal, which maybe the visible light, UV, IR, laser, magnet, or the supersonic wave. Therefore, the relative position of components of the gripper is determined, thereby indicating the gripping status of the patterning device. Furthermore, if the gripping status is determined to be successful and correct, the gripping status sensor signal indicates that the following-up steps will be proceeded, otherwise the gripping status sensor signal indicates that the following-up steps will be paused and an alarm will be released.

In step 56, the interaction of an angle detection signal from an angle sensor with one edge of the patterning device is detected by the angle sensor, and then an angle sensor signal is outputted to the control unit. For example, detection of strong reflection of the angle detection signal from the detected edge may indicate that the patterning device is correctly at a certain desired angle position, and when this occurs then the angle sensor signal indicates proceeding of following-up steps, otherwise the angle sensor signal indicates that the following-up steps will be paused and an alarm will be released. The angle detection signals maybe the visible light, UV, IR, laser, magnet, or supersonic wave. It is noted that in a preferred example of the present invention step 54 is followed by step 56, but the other way around may also be implemented.

Figure 7:
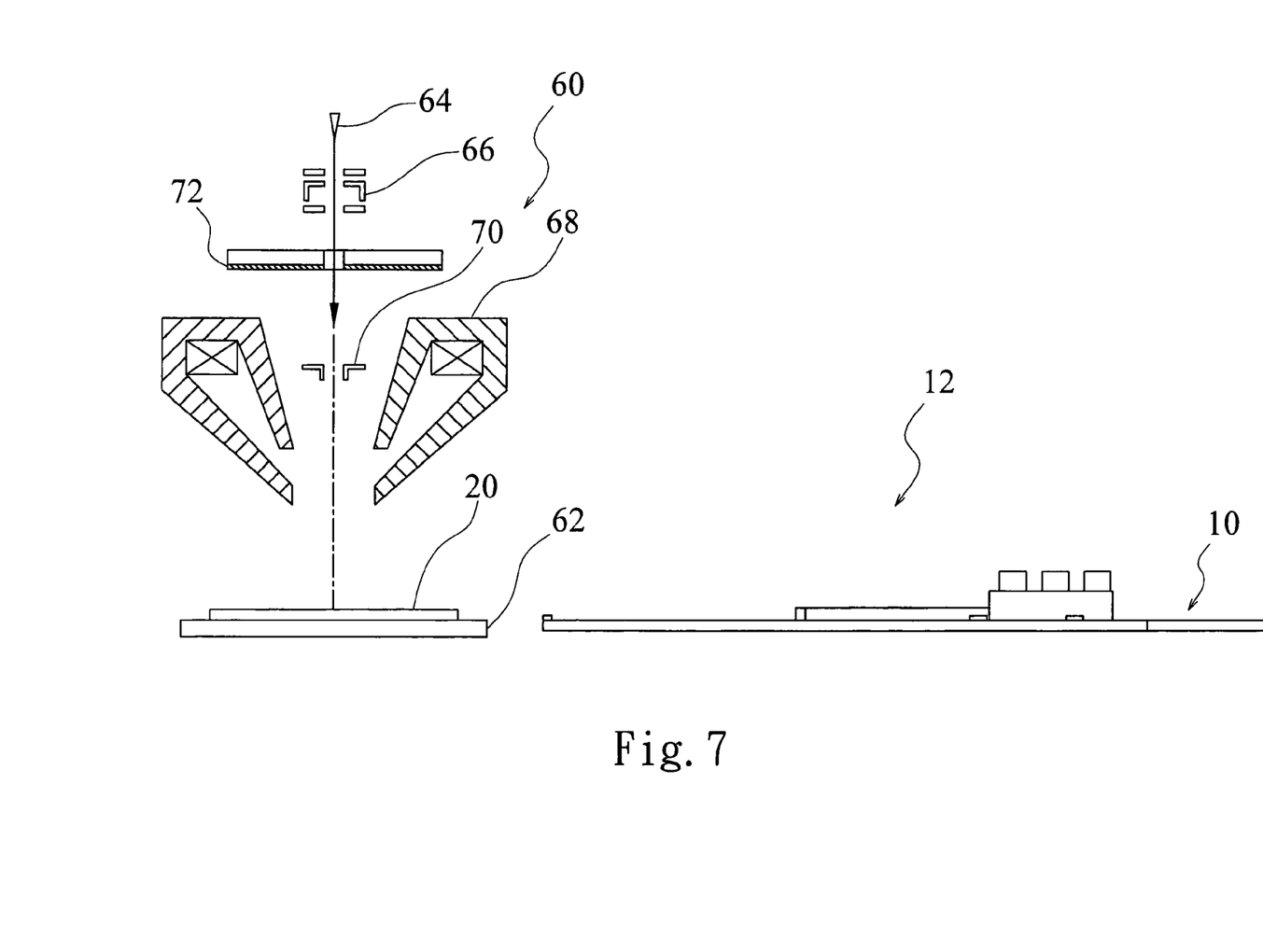
FIG. 7 is a schematic diagram illustrating a charged particle beam imaging system for inspecting a patterning device in accordance with another example of the present invention.

In the present invention, a patterning device imaging system involving charged particle beam imaging for inspecting a patterning device is disclosed. Please refer to FIG. 7, The patterning device imaging system 60 involving charged particle beam imaging comprises: a support member 62 for supporting a patterning device 20 thereon; a charged particle beam generator 64 for generating a primary charged particle beam; a condenser lens module 66 for condensing the primary charged particle beam; a probe forming objective lens module 68 for focusing the condensed primary charged particle beam into a charged particle beam probe; a charged particle beam deflection module 70 for scanning the charged particle beam probe across a surface of the patterning device 20; a secondary charged particle detector module 72 for detecting secondary charged particles generated from the patterning device surface when being bombarded by the charged particle beam probe; and a patterning device handling apparatus 10 for placing the patterning device 20 on the support member 62, wherein the patterning device handling apparatus 10 comprises a gripper 12 capable of holding the patterning device 20 at different angles. The patterning device handling apparatus 10 and the method of placing a patterning device on a support member within a second chamber from a first chamber have been illustrated and described and will not be repeated here.

In the present invention, the patterning device handling apparatus can hold the pattering device at different angles by using a plurality of first positioning projections and second positioning projections. Therefore, this patterning device handling apparatus is suitable for job scenarios of a patterning device with non-circle shapes. In a preferred example, the patterning device is with a parallelogram shape, such as the mask for semiconductor lithography process. The present is to increase the function of the patterning device imaging system involving charged particle beam imaging for inspecting a pattering device. The patterning device imaging system has the advantage of the high usage elasticity.

Although the present invention has been explained in relation to its preferred example, it is to be understood that other modifications and variation can be made without departing the spirit and scope of the invention as hereafter claimed.

What is claimed is:

1. A patterning device handling apparatus for use in charged particle beam imaging, comprising:
    a gripper for holding a patterning device at different angles, said gripper comprising a first gripping member and a second gripping member, with said first gripping member for supporting said patterning device thereon and said second gripping member for fixing said patterning device in place through linear movement along a straight line track,
    wherein said first gripping member is equipped with a first plurality of positioning projections, and said second gripping member is equipped with a second plurality of positioning projections,
    wherein when said patterning device is held at one angle, said first plurality of positioning projections abut against one edge of said patterning device and said second plurality of positioning projections abut against the opposite edge of said patterning device, and when said patterning device is held at another angle, said first plurality of positioning projections abut against two neighboring edges of said patterning device, and said second plurality of positioning projections abut against the other two neighboring edges of said patterning device; and
    a gripping force provider connected to said second gripping member for providing a gripping force to said second gripping member thereby causing said linear movement of said second gripping member.

2. The patterning device handling apparatus of claim 1, wherein said patterning device comprises a parallelogram shape.

3. The patterning device handling apparatus of claim 1, further comprising an angle sensor for determining the angle of said patterning device via detecting interaction of an angle detection signal from said angle sensor with one edge of said patterning device, and whereupon outputting an angle sensor signal to a control unit.

4. The patterning device handling apparatus of claim 3, wherein
    when said patterning device is held at said one angle, said angle sensor detects strong reflection of said angle detection signal from said detected edge of said patterning device, whereby outputting said angle sensor signal to said control unit indicating the same,
    and when said patterning device is held at said another angle, said angle sensor detects weak or no reflection of said angle detection signal from said detected edge of said patterning device, whereby outputting said angle sensor signal to said control unit indicating the same.

5. The patterning device handling apparatus of claim 3, wherein said angle detection signal comprises one selected from the group consisting of the following, or any combination thereof: visible light, UV, IR, laser, supersonic wave.

6. The patterning device handling apparatus of claim 1, further comprising a gripping status sensor for determining a gripping status of said patterning device, said gripping status sensor comprising a set of gripper detection signal transmitters and receivers correspondingly arranged on said first gripping member and said second gripping member or said gripping force provider,
    wherein during said linear movement of said second gripping member, when one of said gripper detection signal transmitters is in alignment with its corresponding receiver, said aligned transmitter and receiver are in communication by a gripper detection signal, such that the position of said second gripping member along said straight line track is determined, thereby indicating the gripping status of said patterning device, whereby a gripping status sensor signal is outputted to said control unit indicating the same.

7. The patterning device handling apparatus of claim 6, wherein said gripper detection signal comprises one selected from the group consisting of the following, or any combination thereof: visible light, UV, IR, laser, magnet, supersonic wave.

8. The patterning device handling apparatus of claim 1, wherein said gripping force provider comprises one selected from the group consisting of the following, or any combination thereof: air cylinder, liquid cylinder, vacuum producer, motor, spring.

9. The patterning device handling apparatus of claim 1, wherein said angles are defined with reference to an imaginary line passing through said first plurality of projections.

10. The patterning device handling apparatus of claim 1, further comprising a plurality of hard pads disposed on said first gripping member for preventing direct contact of said patterning device from said first gripping member.

11. A method of placing a patterning device on a support member within a second chamber from a first chamber for charged particle beam imaging, comprising:
    adjusting said patterning device to one angle position;
    grasping said patterning device at said one angle position using a gripper;
    placing, using said gripper, said patterning device at said one angle position on a rotation member set within said first chamber;
    rotating said rotation member to cause said patterning device to rotate to another angle position;
    grasping said patterning device at said another angle position using said gripper;
    moving, using said gripper, said patterning device at said another angle position to said second chamber; and
    placing, using said gripper, said patterning device at said another angle position on said support member.

12. The method of claim 11, after the step of grasping said patterning device at said another angle position, further comprising
    placing, using said gripper, said patterning device at said another angle position into a buffer storage; and
    grasping said patterning device at said another angle position using said gripper for subsequently moving said patterning device to said second chamber using said gripper.

13. The method of claim 11, after the step of grasping said patterning device at said one angle position and said another angle position, further comprising detecting a gripping status of said patterning device via detecting alignment of a plurality of gripper detection signal transmitters and corresponding receivers arranged on said gripper, and whereupon outputting a gripping status sensor signal to a control unit,
   wherein when one of said gripper detection signal transmitters is in alignment with its corresponding receiver, said aligned transmitter and receiver are in communication by a gripper detection signal, such that the relative positions of components of said gripper is determined, thereby indicating the gripping status of said patterning device,
   if said gripping status is determined to be successful and correct, said gripping status sensor signal indicates proceeding of the process, otherwise said gripping status sensor signal indicates pause of the process and an alarm to be released.

14. The method of claim 13, wherein said gripper detection signal comprises one selected from the group consisting of the following, or any combination thereof: visible light, UV, IR, laser, magnet, supersonic wave.

15. The method of claim 11, after the step of grasping said patterning device at said one angle position, further comprising detecting an angle position of said patterning device via detecting interaction of an angle detection signal from an angle sensor with one edge of said patterning device, and whereupon outputting an angle sensor signal to a control unit,
   wherein if said angle sensor detects strong reflection of said angle detection signal from said detected edge of said patterning device, said angle sensor signal indicates proceeding of the process, otherwise said angle sensor signal indicates pause of the process and an alarm to be released; and
   after the step of grasping said patterning device at said another angle position, further comprising detecting said angle position of said patterning device via detecting interaction of said angle detection signal from an angle sensor with one edge of said patterning device, and whereupon outputting said angle sensor signal to said control unit,
   wherein if said angle sensor detects weak or no reflection of said angle detection signal from said detected edge of said patterning device, said angle sensor signal indicates proceeding of the process, otherwise said angle sensor signal indicates pause of the process and an alarm to be released.

16. The method of claim 15, wherein said angle detection signal comprises one selected from the group consisting of the following, or any combination thereof: visible light, UV, IR, laser, supersonic wave.

17. A patterning device imaging system involving charged particle beam imaging for inspecting a pattering device, comprising:
   a support member for supporting a patterning device thereon during charged particle beam imaging;
   a charged particle beam generator for generating a primary charged particle beam;
   a condenser lens module for condensing generated said primary charged particle beam;
   a probe forming objective lens module for focusing condensed said primary charged particle beam into a charged particle beam probe;
   a charged particle beam deflection module for scanning said charged particle beam probe across a surface of said patterning device;
   a secondary charged particle detector module for detecting secondary charged particles generated from said patterning device surface when being bombarded by said charged particle beam probe; and
   a patterning device handling apparatus for placing said patterning device on said support member, said patterning device handling apparatus comprising:
      a gripper for holding said patterning device at different angles, said gripper comprising a first gripping member and a second gripping member, with said first gripping member for supporting said patterning device thereon and said second gripping member for fixing said patterning device in place through linear movement along a straight line track,
      wherein said first gripping member is equipped with a first plurality of positioning projections, and said second gripping member is equipped with a second plurality of positioning projections,
      wherein when said patterning device is held at one angle, said first plurality of positioning projections abut against one edge of said patterning device and said second plurality of positioning projections abut against the opposite edge of said patterning device, and when said patterning device is held at another angle, said first plurality of positioning projections abut against two neighboring edges of said patterning device, and said second plurality of positioning projections abut against the other two neighboring edges of said patterning device; and
      a gripping force provider connected to said second gripping member for providing a gripping force to said second gripping member thereby causing said linear movement of said second gripping member.

18. The patterning device imaging system involving charged particle beam imaging of claim 17, wherein said patterning device comprises a parallelogram shape.

19. The patterning device imaging system involving charged particle beam imaging of claim 17, further comprising an angle sensor for determining the angle of said patterning device via detecting interaction of an angle detection signal from said angle sensor with one edge of said patterning device, and whereupon outputting an angle sensor signal to a control unit.

20. The patterning device imaging system involving charged particle beam imaging of claim 19, wherein
   when said patterning device is held at said one angle, said angle sensor detects strong reflection of said angle detection signal from said detected edge of said patterning device, whereby outputting said angle sensor signal to said control unit indicating the same,
   and when said patterning device is held at said another angle, said angle sensor detects weak or no reflection of said angle detection signal form said detected edge of said patterning device, whereby outputting said angle sensor signal to said control unit indicating the same.

21. The patterning device imaging system involving charged particle beam imaging of claim 20, wherein said angle detection signal comprises one selected from the group consisting of the following, or any combination thereof: visible light, UV, IR, laser, supersonic wave.

22. The patterning device imaging system involving charged particle beam imaging of claim 17, further comprising a gripping status sensor for determining a gripping status of said patterning device, said gripping status sensor comprising a set of gripper detection signal transmitters and receivers correspondingly arranged on said first gripping member and said second gripping member or said gripping force provider, wherein during said linear movement of said second gripping member, when one of said gripper detection signal transmitters is in alignment with its corresponding receiver, said aligned transmitter and receiver are in communication by a gripper detection signal, such that the position of said second gripping member along said straight line track is determined, thereby indicating the gripping status of said patterning device, whereby a gripping status sensor signal is outputted to a control unit indicating the same.

23. The patterning device imaging system involving charged particle beam imaging of claim 22, wherein said gripper detection signal comprises one selected from the group consisting of the following, or any combination thereof: visible light, UV, IR, laser, magnet, supersonic wave.

24. The patterning device imaging system involving charged particle beam imaging of claim 17, wherein said gripping force provider comprises one selected from the group consisting of the following, or any combination thereof: air cylinder, liquid cylinder, vacuum producer, motor, spring.

* * * * *